United States Patent [19]

Okuda et al.

[11] Patent Number: 5,025,167

[45] Date of Patent: Jun. 18, 1991

[54] ION IMPLANTATION APPARATUS

[75] Inventors: Soichiro Okuda; Tetsuya Nakanishi; Shigeo Sasaki; Kazuhiko Noguchi, all of Amagasaki, Japan

[73] Assignee: Mitsubishi Denki Kabushiki Kaisha, Tokyo, Japan

[21] Appl. No.: 533,769

[22] Filed: Jun. 6, 1990

[30] Foreign Application Priority Data

Jun. 6, 1989 [JP] Japan .................. 64-144967
Nov. 24, 1989 [JP] Japan .................. 64-305122

[51] Int. Cl.$^5$ ................ H01J 37/317; H01J 37/145
[52] U.S. Cl. ........................... 250/492.2; 250/397; 250/398
[58] Field of Search ............... 250/492.2, 492.23, 305, 250/397, 492.21, 398

[56] References Cited

U.S. PATENT DOCUMENTS 4,514,638  4/1985  Lischke et al. .......... 250/492.23
4,524,277  6/1985  Shimura et al. ............. 250/397
4,550,258  10/1985  Omata et al. ........... 250/492.23
4,757,208  7/1988  McKenna et al. ............ 250/398
4,899,060  2/1990  Lischke .................. 250/505.1

Primary Examiner—Jack I. Berman
Assistant Examiner—Kiet T. Nguyen
Attorney, Agent, or Firm—Oblon, Spivak, McClelland, Maier & Neustadt

[57] ABSTRACT

An ion implantation apparatus comprises an ion beam measuring device to measure and analyze the shape of a beam projected on a substrate for ion implantation and the quantity of current obtained by the ion beam, an analyzing slit member having an opening whose width is changeable, which is located in the ion beam track to extract only implantation ions, and a shaping slit member having an opening whose width is changeable, which is located behind the analyzing slit member to determine the shape of the beam to be projected on the substrate for ion implantation, wherein the widths of the openings of the analyzing slit member and the shaping slit member are changed on the basis of the shape of the beam and the quantity of current obtained as a result of the measurement by the ion beam measuring device.

6 Claims, 5 Drawing Sheets

ION IMPLANTATION APPARATUS

The present invention relates to an ion implantation apparatus used for implantaing ions in manufacturing semiconductor devices. More particularly it relates to an ion implantation apparatus capable of keeping the shape of beam on a substrate for ion implantation constant and of suppressing in the reduction of an ion beam current quantity.

FIG. 4 shows a construction of an ion implantation apparatus disclosed in "electron.ion beam handbook (p. 585-593)". In FIG. 5, a reference numeral 1 designates an ion source to produce ions and to emit an ion beam, a numeral 2 designates a mass analyzing device for analyzing implantation ions and unnecessary ions, a numeral 3 designates an analyzing slit member having an opening whose width is fixed, which extracts only the implantation ions, a numeral 4 designates a shaping slit member having an opening whose width is fixed, which is located behind the analyzing slit member 3 and which determines the shape of the ion beam at a plane 5 to which ions are implanted, a numeral 6 designates an emission point of the ion beam, a numeral 7 designates the outermost beam track of the implantation ions, a numeral 8 designates the outermost beam track of the unnecessary ions, numerals 9 and 10 designate respectively the central beam tracks of the implantation ions and the unnecessary ions, a numeral 11 designates a converging point of the implantation ion beam in the x direction, numerals 12 and 13 respectively designate end surfaces of beam-entering side and beam-emitting side of the mass analyzing device 2, and a numeral 14 designates an ion beam measuring device which comprises a measuring section for measuring the ion beam and a data analyzing section such as a computer to analyze data. With respect to a coordinate system, let a direction perpendicular to the central beam track 9 be an x coordinate axis and let the direction perpendicular to the paper surface be a y coordinate axis.

The operation of the conventional ion implantation apparatus will be described. Ions are produced in the ion source 1 and the ions having energy necessary for ion implantation are drawn as an ion beam. In the ion beam, there are unnecessary ions such as ions of an isotope of the implantation ion and ions of spattered particles emitted from a structural element of the ion source and so on, which are needless for carrying out the ion implantation. Ions which are generally used for manufacturing semiconductor devices are, for instance, $^{75}As^+$. As unnecessary ions, there are $^{75}As^{2+}$ which has different ion charge number but which is the same kind as the implantation ions, or Fe ions as the ions of spattered particles emitted from a structural element for the ion source. In order to extract only the implantation ions from the ion beam, the mass analyzing device 2 is used to analyze the ion beam. The mass analyzing device 2 is located so that the end surface 12 at the entering side of the analyzing device 2 is positioned at a distance of $L_1$ from the emission point 6 of the ion source 1. As the mass analyzing device 2, a sector magnet type analyzer having a radius of rotation R and an angle of rotation $\Phi$ is used. The mass analyzing device 2 separates implantation ions from unnecessary ions, and the ion beam of implantation ions is converged at a point in the direction of the x axis. The implantation ion beam is converged at a converging point which is apart by a distance $L_2$ (which is determined from the below-mentioned equation) from the end surface of the beam emitting side of the mass analyzing device 2.

$$L_2 = L_1[\{1+(R/L_1)\tan\Phi\}/\{-1+(L_1/R)\tan\Phi\}]$$

At the converging point 11, the central beam track 10 of unnecessary ions is deviated by $\Delta x$ in the x axis direction from the central beam track 9 of the implantation ions. The value of $\Delta x$ is obtainable from the following equation:

$$|\Delta x| = (\delta_m/2m_0)\cdot[R(1-\cos\Phi) = L_2 \sin\omega]$$

(where $m_0$ is the molecular weight of ion and $\delta_m$ is a difference in molecular weight between unnecessary ion to be separated and implantation ion).

Accordingly, only the implantation ions are extracted by the analyzing slit member 3 having an opening of fixed width at the converging point 11. In this case, the dimension of the opening of the analyzing slit member 3 is so determined that the half of the width of the opening $Xs/2$ is greater than the half of the width of the implantation ion beam at the converging point 11 of the outermost beam track 7, and lower than the value obtained by subtracting the half of the width of the unnecessary ion beam at the converging point 11 from the minimum value of $|\Delta x|$.

The extracted implantation ions are directed with an angle of divergence from the converging point 11 to the plane to be subjected to ion implantation 5 which is a distance $L_3$ apart from the converging point 11. In this case, the outermost beam track 7 of the implantation ions is restricted by the shaping slit member 4 so as to give a predetermined width $X_B$ to the implantation ion beam at the ion implantation plane 5. For this purpose, the shaping slit member 4 having an opening of fixed width $X_F$ (which is determined by the below-mentioned equation) is located at a position apart from a distance $L_4$ from the converging point 11.

$$X_F = X_B \cdot L_4/L_3$$

The deviation of the ion beam in the x axis direction has been described. The analysis of the implantation ions and the unnecessary ions in the y axis direction of the ion beam is irrelevant. The width of the ion beam in the y axis direction at the plane 5 to be implanted with ions is primarily determined by the openings (whose widths are fixed) in the y axis direction of the analyzing slit member 3 and the shaping slit member 4.

The shape of the ion beam on the plane 5 and an electric current quantity which have been obtained are monitored by the ion beam measuring device 14.

The conventional ion implantation apparatus having the above-mentioned construction has such a problem that it was difficult to provide a constant shape of the ion beam on the plane for ion implantation due to factors: the distance $L_1$ between the emission point 6 and the end surface 12 of beam-entering side of the mass analyzing device 2, which varies depending on a condition of generating ions from the ion source, the distance $L_2$ between the end surface of beam-emitting side of the mass analyzing device 2 and the converging point 11 which results from a kind of implantation ions, the energy of the implantation ions and the quantity of an electric current due to the space charge effect of ions, the distance $L_3$ between the converging point 11 and the ion implantation plane 5 which varies depending on a change of the distance $L_2$, and the distance $L_4$ between the converging point 11 and the shaping slit member 4.

It is an object of the present invention to provide an ion implantation apparatus capable of controlling an ion beam current quantity on a plane for ion implantation and of maintaining the shape of an ion beam to be constant.

It is an object of the present invention to provide an ion implantation apparatus capable of providing constant function of selection of charged particles and reducing a reject rate of semiconductor devices.

In accordance with the present invention, there is provided an ion implantation apparatus which comprises:
  an ion beam measuring device to measure and analyze the shape of a beam projected on a substrate for ion implantation and the quantity of current obtained by the ion beam,
  an analyzing slit member having an opening whose width is changeable, which is located in the ion beam track to extract only implantation ions, and
  a shaping slit member having an opening whose width is changeable, which is located behind the analyzing slit member to determine the shape of the beam to be projected on the substrate for ion implantation, wherein the widths of the openings of the analyzing slit member and the shaping slit member are changed on the basis of the shape of the beam and the quantity of current obtained as a result of the measurement by the ion beam measuring device.

In accordance with the present invention, there is provided an ion implantation apparatus which comprises:
  an ion generating device,
  a two-pole electromagnet device placed facing the ion generating device to deflect ions emitted from the ion generating device,
  an ion selecting device placed at the side of emission of the electromagnetic device to select ions,
  a material positioning device for positioning a material for ion implantation, and
  a moving device for moving the ion selecting device.

Several embodiments of the ion implantation apparatus of the present invention will be described with reference to the drawings.

Figure 1:
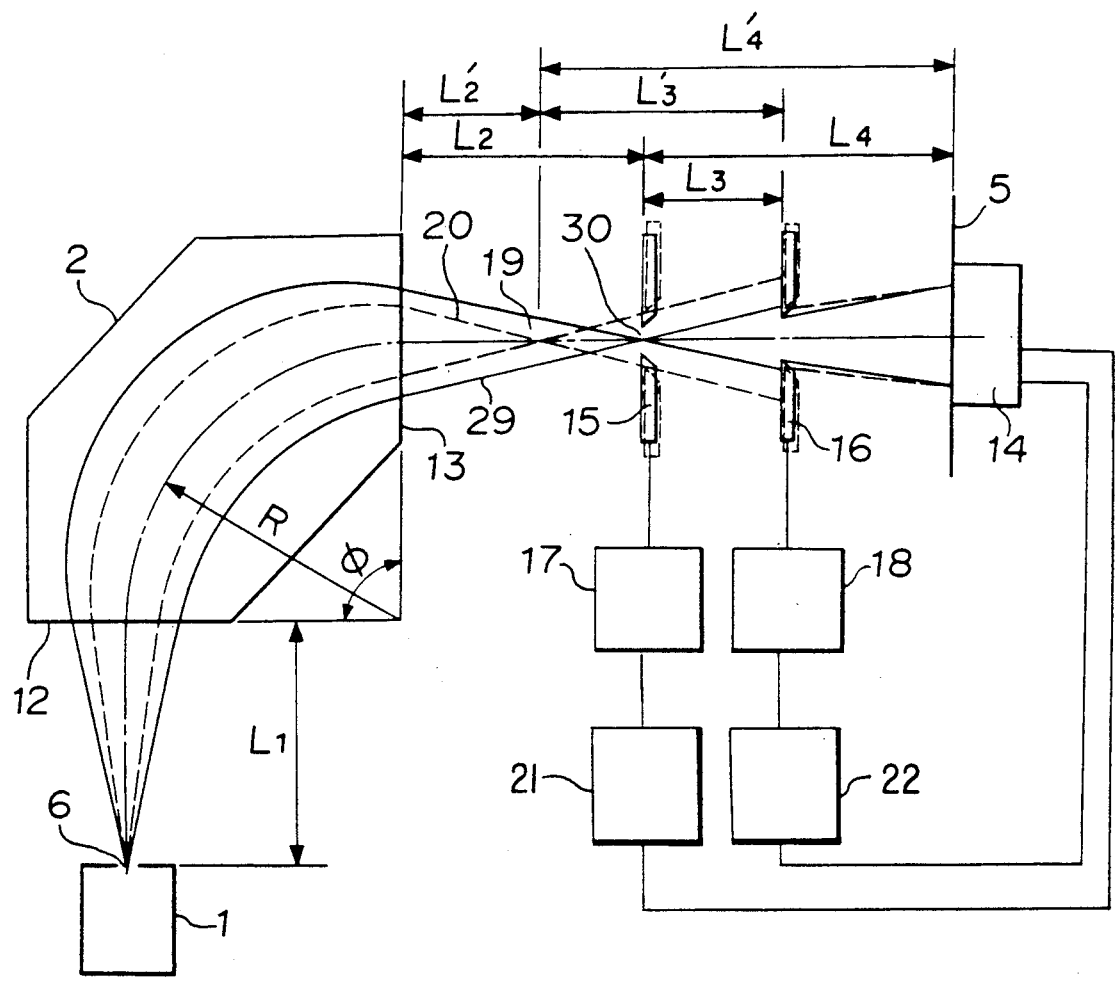
FIG. 1 is a diagram showing an embodiment of the ion implantation apparatus according to the present invention.

FIG. 1 is a diagram showing an embodiment of the ion implantation apparatus of the present invention wherein the same reference numerals designate the same or corresponding parts, and accordingly description of these parts is omitted. In FIG. 1, a reference numeral 29 designates the outermost ion beam track of ions A used for ion implantation, a numeral 30 designates a converging point in the x axis direction of the beam of ions A, a numeral 15 designates an analyzing slit member having a width changeable type opening, a numeral 16 designates a shaping slit member having a width changeable type opening, a numeral 17 designates a first driving device for the analyzing slit member 15 and a numeral 18 designates a second driving device for the shaping slit member 16. A numeral 19 designates a converging point in the x axis direction of the beam of ions B for implantation, which converges at a position which is closer to the mass analyzing device 2 with respect to a converging point 30 where the ions A converges, and a numeral 20 designates the outermost beam track of the ions B.

Figure 3A:
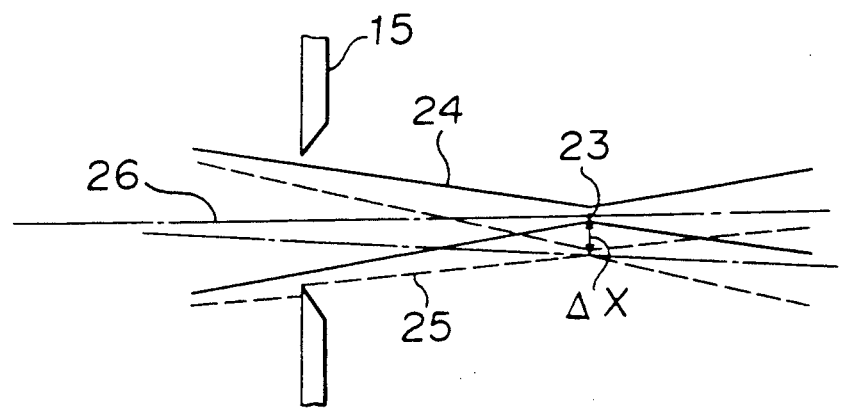
FIGS. 3a and 3b are respectively diagrams showing a relation of a position where an analyzing slit member having an opening of changeable width is located to a beam track of ions.
Figure 3B:
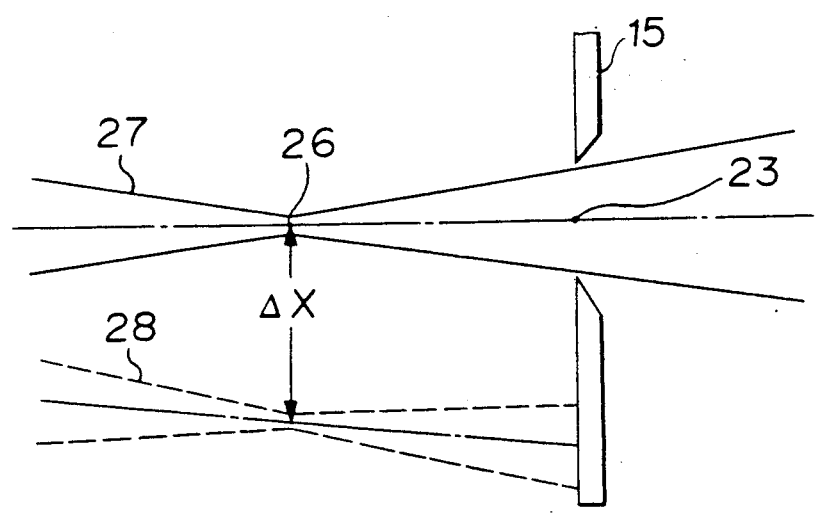

FIGS. 3a and 3b are respectively diagrams showing a relation of a position of the analyzing slit member having a width changeable type opening placed in the beam track of implantation ions to atomic weight or molecular weight. In particular, FIG. 3a shows that the analyzing slit having a width changeable type opening 15 is placed at the converging point of a beam of implantation ions C having the smallest atomic weight or molecular weight among various types of implantation ions which are produced in an ion implantation process. FIG. 3b shows that the analyzing slit 15 having a width changeable type opening 15 is placed at the converging point of a beam of implantation ions D having the largest atomic weight or molecular weight among various types of implantation ions which are produced in an ion implantation process. In FIGS. 3a and 3b, a numeral 23 designate a converging point in the x axis direction of a beam of implantation ions D, a numeral 24 designates the outermost beam track of implantation ions D, a numeral 25 designates the outermost beam track of unnecessary ions, a numeral 26 designates a converging point in the x axis direction of a beam of implantation ions C, a numeral 27 designates the outermost beam track of implantation ions C and a numeral 28 designates the outermost beam track of unnecessary ions.

The operation of the above-mentioned embodiment of the ion implantation apparatus of the present invention will be described.

In the ion implantation apparatus as shown in FIG. 1, when implantation ions A are replaced by implantation ions B, for instance, the converging point moves from the first point 30 to the second point 19 due to space charge effect, whereby the distance between the end surface of beam-entering side 13 of the mass analyzing device 2 and the converging point 19 of implantation ions B becomes $L_2'$; the distance between the converging point 19 of implantation ions B and the plane for ion implantation 5 becomes $L_4'$, and the distance between the converging point 19 of implantation ions B and the shaping slit member 16 becomes $L_3'$. This results in a change in the shape of the ion beam projected on the plane for ion implantation 5. In the ion implantation apparatus of the present invention, however, the width of the opening formed in the analyzing slit member is having a width changeable type opening is changed by the first driving device 17 on the basis of the shape of the ion beam and the quantity of electric current which are measured and analyzed by the ion beam measuring device 14 so that unnecessary ions of the implantation ions B, e.g. ions of an isotope can be eliminated, and the width of the opening is made greater than the cross-surface area of the outermost beam track 20 of implantation ions B, or ions for implantation can be extracted as much as possible. Further, the width of the opening formed in the shaping slit member 16 having a width changeable type opening is changed by the second driving unit 18 on the basis of the shape of the ion beam which is measured and analyzed by the ion beam measuring device 14. By the above-mentioned arrangement, it is possible to suppress the attenuation of the intensity of the beam current on the plane for ion implantation 5 and to maintain the shape of the ion beam for ion implantation to be constant. Accordingly, a constant shape of an ion beam can be provided even though any kind of a implantation ion is used.

It is, however, necessary to dispose the analyzing slit 15 having a width changeable type opening at the position of the converging point 23 of implantation ions D in FIG. 3 because for the implantation ions D having the largest atomic weight or molecular weight, the resolution $\Delta x$ is small as shown in FIG. 3a, whereby the analysis of the implantation ions D and unnecessary ions can not be achieved as is clear from the ion beam tracks of the implantation ions D and the unnecessary ions.

When the implantation ions C are used, the resolution $\Delta x$ is large as shown in FIG. 3b. Accordingly, a sufficient analysis can be performed for the beam track 27 of the implantation ions and the beam track 28 of unnecessary ions even when the analyzing slit member 15 is arranged at the converging point 23. Accordingly, the analyzing slit member 15 should be arranged at the converging point 23 for the implantation ions D, but not at the converging point 26 for the implantation ions C which is closer to the mass analyzing device 2.

Figure 2:
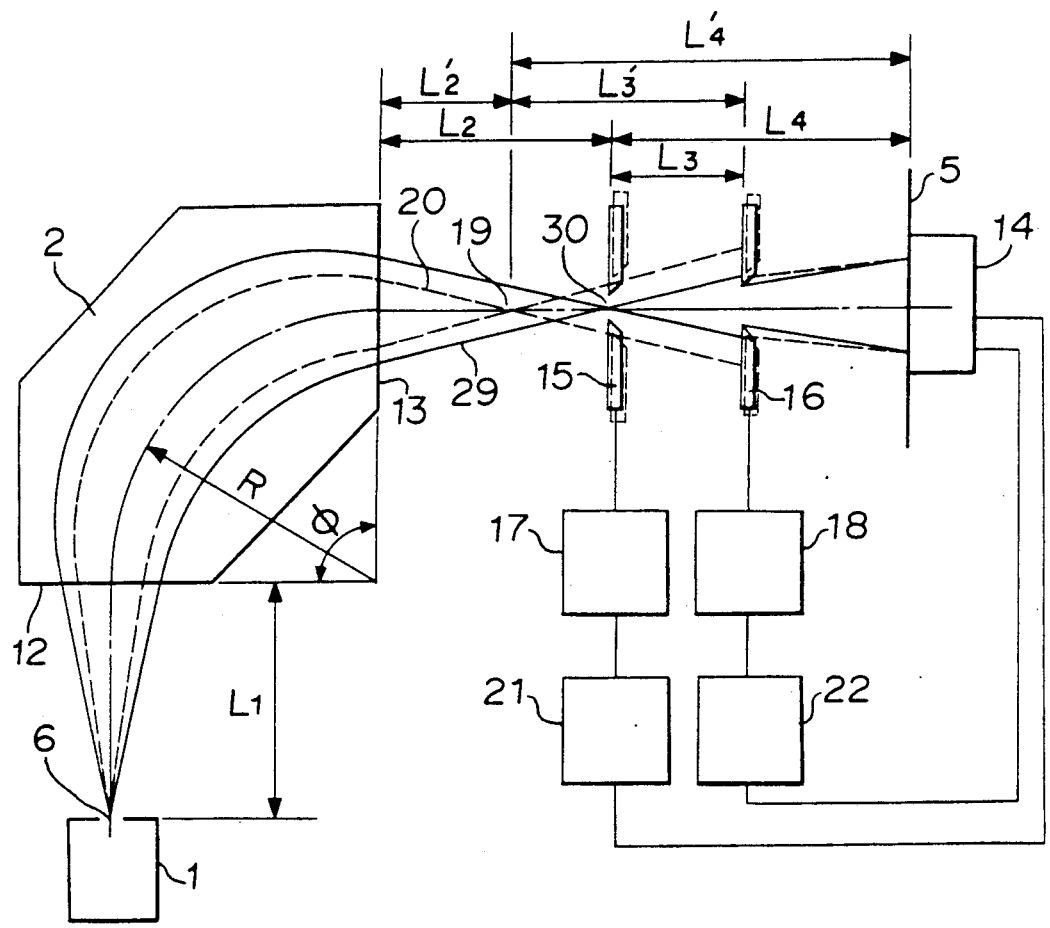
FIG. 2 is a diagram showing another embodiment of the ion implantation apparatus according to the present invention.

FIG. 2 is a diagram showing another embodiment of the ion implantation apparatus according to the present invention wherein the same reference numerals as in FIG. 1 designate the same or corresponding parts, and accordingly description of these parts is omitted. Reference numerals 21 and 22 respectively designate control units for controlling the driving devises 17, 18 for the analyzing slit member 15 and the shaping slit member 16. The control units 21, 22 are respectively connected to the ion beam measuring device 14.

In the ion implantation apparatus according to the second embodiment, the ion beam measuring device 14 measures and analyzes the shape of an ion beam and the intensity of the electric current, and a result of the measurement and analysis is converted into data signals in data analyzing section which is a part of the ion beam measuring device 14 so that the data signals are supplied to the control units 21, 22. The control units 21, 22 control the driving devices 17, 18 on the basis of the supplied data signals so that the width of the openings of the analyzing slit member 15 and the shaping slit member 16 are changed. Accordingly, the shape of the ion beam on the plane for ion implantation 5 can be always constant by controlling the width of the openings of the slit members.

In the above-mentioned first and second embodiments, description has been made as to a case that the shape of the ion beam changes on the plane for ion implantation due to use of different kind of ion. However, in accordance with the present invention, the shape of the ion beam on the plane for ion implantation can be constant even when the same kind of ion is used, but an acceleration voltage and a beam current are different. Further, it is possible to control the shape of the ion beam to be a predetermined shape.

In accordance with the above-mentioned embodiments of the present invention, it is possible to provide a constant shape of ion beam on a plane for ion implantation, which varies due to a kind of implantation ions, the energy of the ions and the intensity of electric current. Further, the attenuation of a beam current on the plane for ion implantation can be suppressed; it is easy to control ions to be fed to the plane in an ion implantation process, and a percentage of deficiency can be reduced.

A third embodiment of the ion implantation apparatus according to the present invention will be described with reference to FIG. 4. A numeral 31 designates a charged particle generating device such as an ion source, a numeral 32 designates a track of charged particles such as ions, a numeral 33 designates a two-pole magnet to deflect the track of charged particles, numerals 34 and 36 designate magnetic pieces positioned at the entering side and the emitting side of the two-pole magnet 33, which are so constructed that a converging point of charged particles can be adjusted by changing the angles 35, 37 of the magnetic pieces 34, 36 placed at each end of the two-pole magnet, numerals 38 and 39 designate respectively an analyzing slit member and a shaping slit member which are movable in the direction of the ion beam axis by driving devices 47 and 48, a numeral 40 designates a material which provides a plane for ion implantation which is disposed by a material disposing device, and a numeral 41 designates a converging point of a beam of charged particles.

The operation of the third embodiment of the ion implantation apparatus will be described. Charged particles such as ions emitted from a charged particle generating device 31 such as an ion source enters into the two-pole magnet 33 through the magnet piece 34 disposed at the end surface of beam-entering side. The track of the charged particles is deflected by about 90°, and the charge particles are converged at the converging point 41 by the converging function of the magnet piece 36.

Figure 4:
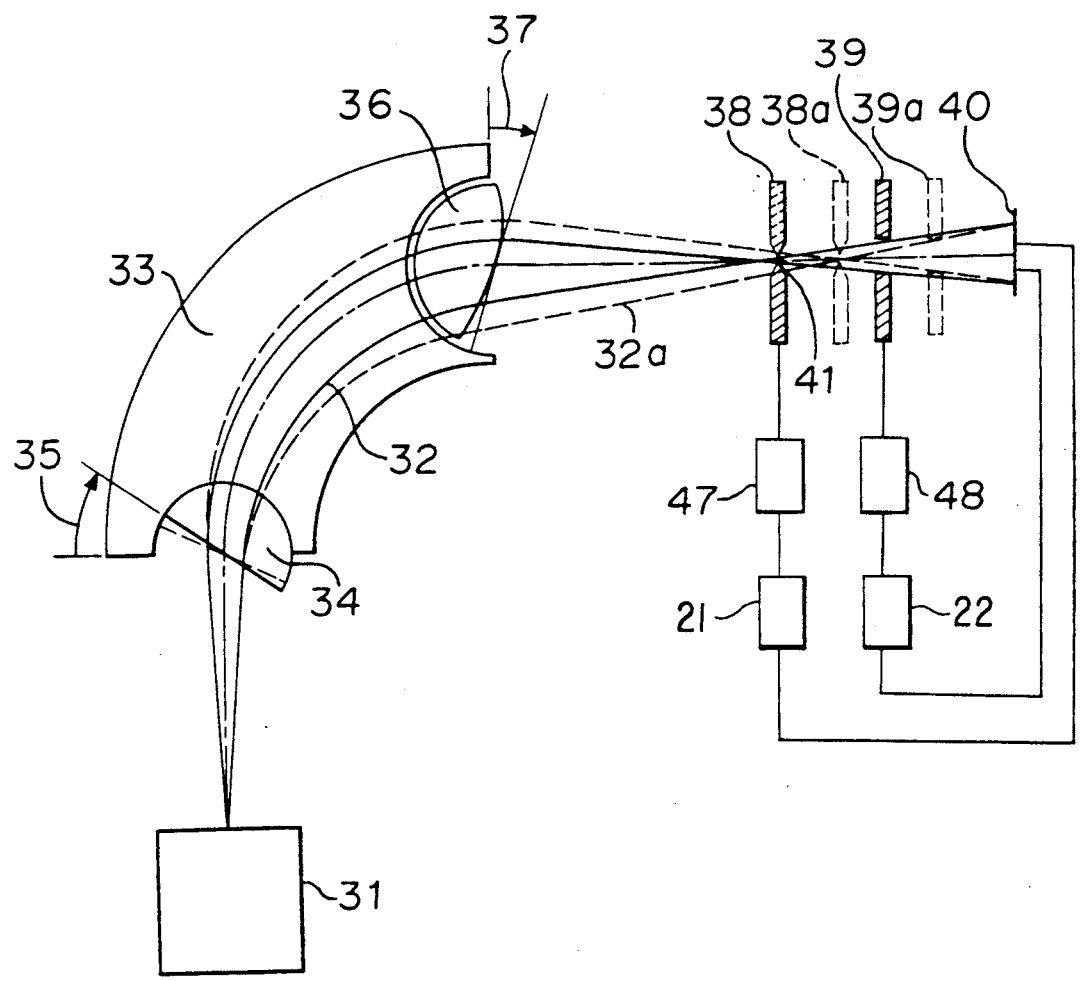
FIG. 4 is a diagram showing another embodiment of the ion implantation apparatus according to the present invention.
Figure 5:
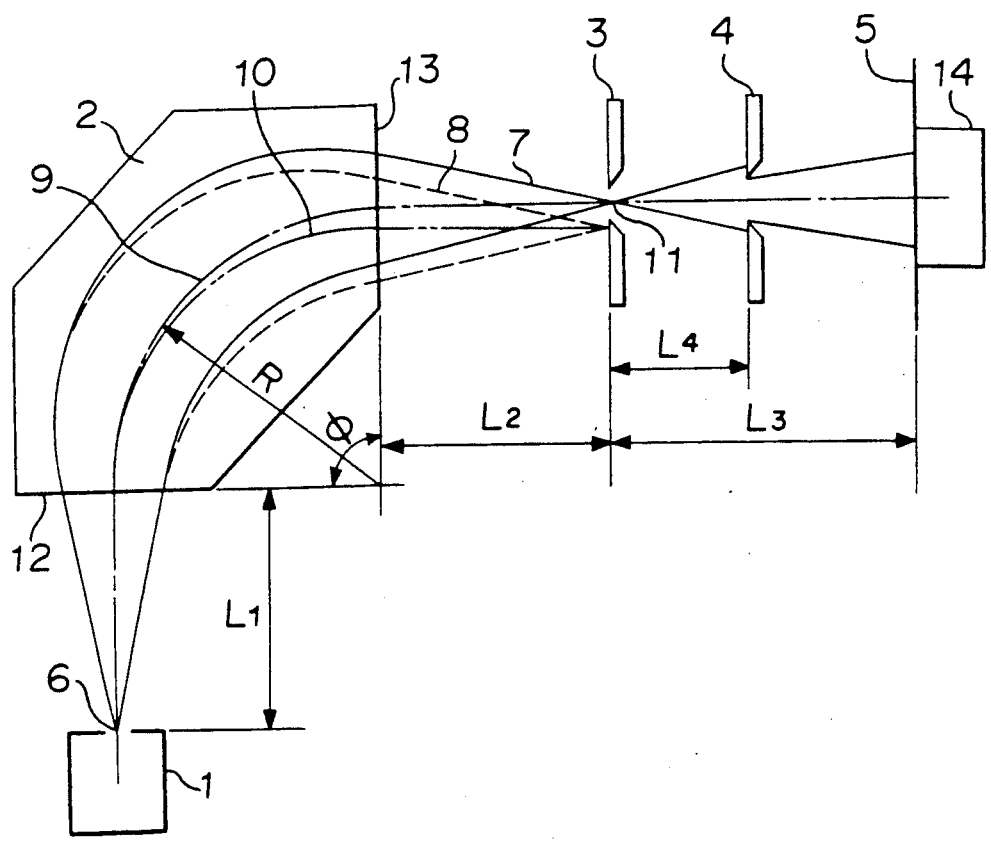
FIG. 5 is a diagram showing a conventional ion implantation apparatus.

When the charged particles are replaced by another kind the particles and the energy of the particles and the intensity of a beam current are changed, the track of the particles varies by the repulsive force of the charged particles as indicated by a numeral 32a in FIG. 4. In this case, by moving the analyzing slit member 38 to a position 38a where the charged particles are converged, and by moving the forming slit member 39 to the corresponding position 39a, the distribution of the charged particles on the plane for ion implantation 40 does not change, whereby there is no uneven distribution of electric current, and a percentage of deficiency of semiconductors can be reduced.

The shaping slit member and the analyzing slit member may be moved together in a case that a range of the movement of the ion implantation apparatus is small even though they are moved separately in the third embodiment.

The slit members may be electrically insulated, and an electric current resulted by the charged particles which are caught by the slit members is measured by connecting ampere meters so that the optimum position for the slit members can be determined.

A two-pole magnet for deflecting the track of a beam at an angle other than 90° may be used.

Thus, in accordance with the third embodiment of the present invention, the same effect as the first and second embodiments can be obtained.

We claim:
1. An ion implantation apparatus which comprises:
an ion beam measuring device to measure and analyze the shape of a beam projected on a substrate for ion implantation and the quantity of current obtained by the ion beam,
an analyzing slit member having an opening whose width is changeable, which is located in the ion beam track to extract only implantation ions, and
a shaping slit member having an opening whose width is changeable, which is located behind the analyzing slit member to determine the shape of beam to be projected on the substrate for ion implantation, wherein the widths of the openings of the analyzing slit member and the shaping slit member are changed on the basis of the shape of the beam and the quantity of current obtained as a result of the measurement by the ion beam measuring device.

2. The ion implantation apparatus according to claim 1, which further comprises driving units for changing the widths of the openings of the analyzing slit member and the shaping slit member, and a control unit for controlling the width of the openings of the slit members.

3. The ion implantation apparatus according to claim 2, wherein said control unit is provided for each of the driving units.

4. An ion implantation apparatus which comprises:
an ion generating device,
a two-pole electromagnetic device placed facing the ion generating device to deflect ions emitted from the ion generating device,
an ion selecting device placed at the side of emission of the electromagnetic device to select ions,
a material positioning device for positioning a material for ion implantation, and
a moving device for moving the ion selecting device.

5. The ion implantation apparatus according to claim 4, wherein the ion selecting device comprises an analyzing slit member and a shaping slit member.

6. The ion implantation apparatus according to claim 5, wherein the analyzing slit member and the shaping slit member are moved in the direction of beam axis by each driving device.

* * * * *